(12) United States Patent
Ku et al.

(10) Patent No.: US 6,492,854 B1
(45) Date of Patent: Dec. 10, 2002

(54) POWER EFFICIENT AND HIGH PERFORMANCE FLIP-FLOP

(75) Inventors: Joseph Ku, Palo Alto, CA (US); Stuart Siu, Castro Valley, CA (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/941,581

(22) Filed: Aug. 30, 2001

(51) Int. Cl.[7] ............................................. H03K 3/286
(52) U.S. Cl. ........................................ 327/202; 327/203
(58) Field of Search ................................ 327/199, 202, 327/544, 540, 143, 203

(56) References Cited

U.S. PATENT DOCUMENTS 5,467,038 A * 11/1995 Motley et al. .............. 327/202
5,789,956 A * 8/1998 Mahant-Shetti et al. .... 327/202
5,982,211 A * 11/1999 Ko ............................. 327/202
6,404,254 B2 * 6/2002 Iwaki et al. ................ 327/214

* cited by examiner

*Primary Examiner*—Dinh T. Le (57) ABSTRACT

A power efficient flip-flop includes a power switch regulating power supplied to a high speed latch in the flip-flop. When the power switch is activated, causing the high speed latch to receive power, the high speed latch captures data received by the flip-flop. The captured data is propagated by the high speed latch to the output of the flip-flop. Simultaneously, the high speed latch transmits the data to a low leakage latch connected to the high speed latch. Then, power is removed from the high speed latch, and the data retained in the low leakage static latch is now released to the output of the flip-flop. The power efficient flip-flop minimizes leakage current generated by the high speed latch by removing a path to ground when power is not provided to the high speed latch. A decoupling device is connected to the power switch to substantially eliminate a coupling effect.

18 Claims, 6 Drawing Sheets

POWER EFFICIENT AND HIGH PERFORMANCE FLIP-FLOP

FIELD OF THE INVENTION

The present invention is generally related to power management techniques for computer chips. More particularly, the present invention is generally related to a power efficient flip-flop design.

BACKGROUND OF THE INVENTION

Flip-Flops are the basic elements in any sequential machine, such as a finite state machine, counter, register file, storage buffer, and the like. Accordingly, the design of the flip-flop has always been a focus of VLSI designers.

Conventional flip-flop designs are mainly focused on performance or area optimization, especially with respect to flip-flops used in microprocessors. However, with the ever increasing demand for power in microprocessor chips, it is imperative that the power efficiency of every circuit, including flip-flops, in a microprocessor chip be maximized. Accordingly, techniques have been developed for reducing power consumption in microprocessor chips, such as placing circuits, including conventional flip-flops, in a sleep mode.

Even when using techniques for reducing power consumption, current semiconductor technology development indicates that transistor off current (i.e., leakage current in each individual device and standby current in the whole chip) is comparable to the transistor "on" current, especially with respect to the 0.1 microns technology era. For example, even when circuits having flip-flops are functioning in an idle or sleep mode, a significant amount of power is dissipated through leakage paths.

SUMMARY OF THE INVENTION

In one respect, the present invention includes an exemplary method for minimizing power consumption by a circuit, such as a flip-flop. The method includes steps of providing power to a first latch in the circuit; capturing data in the first latch; transmitting data to a second latch in the circuit; and removing power from the first latch.

In another respect, the present invention includes an exemplary power efficient circuit having a first latch and a second latch connected to the first latch. The second latch is configured to receive data captured by the first latch. The circuit further includes a power switch connected to the first latch, and the power switch regulates power provided to the first latch. The first latch includes a high speed latch and the second latch includes a low leakage latch. The power switch minimizes power consumption by limiting the period of time power is provided to the high speed latch. Also, the power efficient circuit minimizes the leakage current generated by the high speed latch when power is not provided to the high speed latch by substantially eliminating a leakage path to ground using a virtual ground, the power switch and a decoupling device.

In comparison to known prior art, certain embodiments of the invention are capable of achieving certain aspects, such as providing an improved flip-flop design to minimize power consumption. Those skilled in the art will appreciate these and other aspects of various embodiments of the invention upon reading the following detailed description of a preferred embodiment with reference to the below-listed drawings.

BRIEF DESCRIPTION OF THE DRAWINGS

The present invention is illustrated by way of example and not limitation in the accompanying figures in which like numeral references refer to like elements, and wherein.

DETAILED DESCRIPTION OF THE INVENTION

In the following detailed description, numerous specific details are set forth in order to provide a thorough understanding of the present invention. However, it will be apparent to one of ordinary skill in the art that these specific details need not be used to practice the present invention. In other instances, well known structures, interfaces, and processes have not been shown in detail in order not to unnecessarily obscure the present invention.

Figure 1:
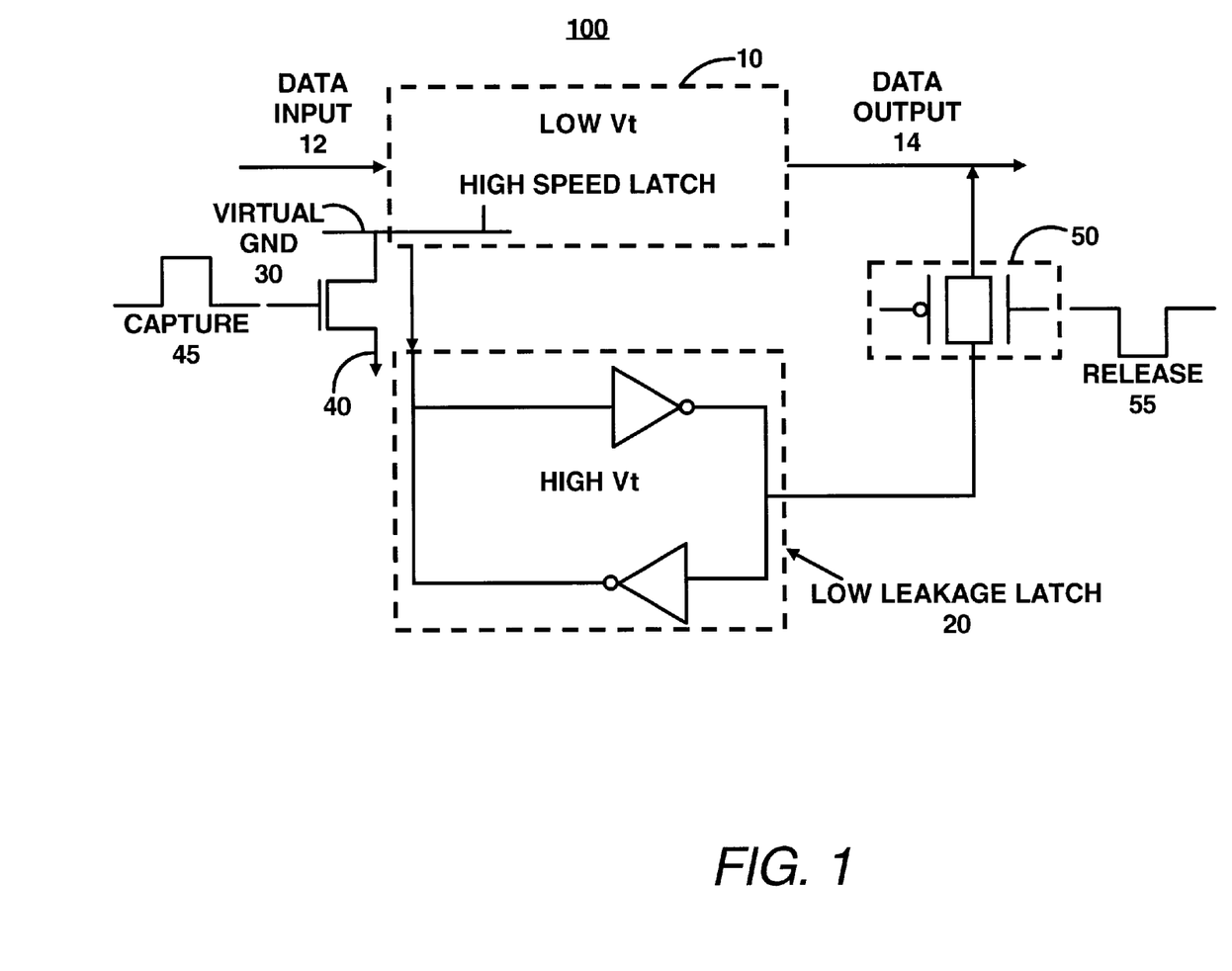
FIG. 1 illustrates a schematic block diagram of an exemplary flip-flop employing principles of the present invention.

FIG. 1 illustrates an exemplary embodiment of a flip-flop 100 employing principles of the present invention. The flip-flop 100 includes a high speed latch 10 connected to a low-leakage latch 20. Data is received by the high speed latch 10 on a data input 12 and transmitted, for example, to a circuit connected to the flip-flop 100 through a data output 14 of the high speed latch 10. The high speed latch 10 may be a low threshold (i.e., low Vt) latch implemented using pseudo-NMOS, domino logic, dynamic logic, and the like. A low threshold latch, when compared to a high threshold latch (i.e., high Vt), typically provides more current at the same driving voltage than a high threshold latch. This generally increases the speed of the low threshold latch, when compared to a high threshold latch. However, low threshold devices generate leakage current (i.e., a typical characteristic of low threshold devices), which increases power consumption. The low leakage latch 20 may include a high threshold latch, which may be slower than a low threshold latch. However, a high threshold latch generally produces minimal leakage current (i.e., a typical characteristic of high threshold devices), which minimizes power consumption.

The high speed latch 10 is connected to a virtual ground 30, rather than a real ground. The virtual ground may include a metal strip, and the like connected to one or more low threshold devices. The virtual ground 30 is connected to a real ground through a power switch 40, which may be an external, low-resistance, high threshold (i.e., high Vt), power switch. The power switch 40 regulates power provided to the high speed latch 10, by connecting and disconnecting a path to the real ground. When the power switch 40 is activated (i.e., closed), the high speed latch 10 receives power and data on the data input 12 is captured. Otherwise, the power switch 40 is deactivated (i.e., open), and the high speed latch 10 is placed in a standby mode (i.e., power is not provided to the high speed latch 10). When the power switch is deactivated, a path to the real ground is disconnected. Therefore, leakage current from the high speed latch is substantially eliminated, and power is conserved.

A capture signal 45 may be used to control the power switch 40. For example, the capture signal 45 may include a pulse that turns on the power switch 40, causing power to be provided to the high speed latch 10 for the duration of the pulse (e.g., for the duration the pulse is active "high"). For example, data is captured by the high speed latch 10 when a short pulse driving the power switch attached to the virtual ground becomes active (e.g., "high"). After the pulse returns to inactive (e.g., "low"), the high speed latch 10 is disconnected from the real ground by the power switch 40 for preventing a possible leakage path in the standby mode.

When data is captured by the high speed latch 10, the data is also simultaneously transmitted to the low leakage latch 20 to retain the data when power is not provided to the high speed latch 10. The low leakage latch 20 is connected to the data output 14 through a release latch 50. The release latch 50 may include complementary transmission gates for allowing a full swing signal to pass through to the data output 14. A full swing signal includes a signal swing from 0 to VDD. If only one NMOSFET is used, rather than a complimentary gate design, a smaller swing signal is produced, which affects signal integrity. When the release latch 50 is activated by the release signal 55, data retained by the low leakage latch 20 is transmitted to the data output 14 of the flip-flop 100 from the low leakage latch 20. The low leakage latch 20 may be continually powered, but minimal leakage current is produced by a low leakage (high threshold) switch. The release latch 50 and the low leakage latch 20 function as data retainers. Accordingly, small transistor sizes that consume less power may be used for latches 20 and 50.

The release signal 55 and the capture signal 45 may be complimentary. Therefore, after data is captured by the high speed latch 10, it would be immediately released to the data output 14 by the low leakage latch 20. Also, the capture signal 45 and the release signal 55 may be derived from a clock signal used by the flip-flop 100.

Figure 2:
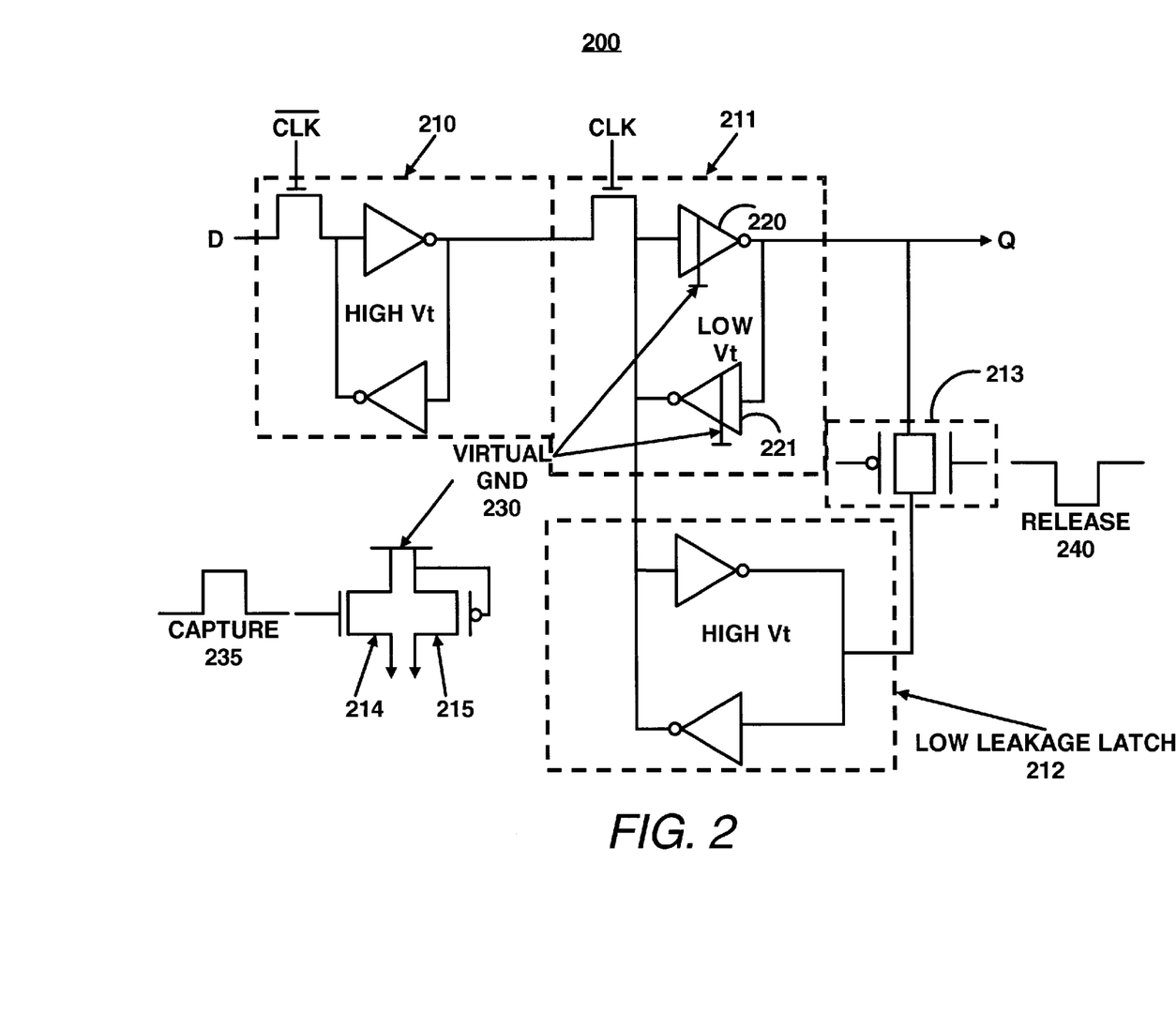
FIG. 2 illustrates an exemplary embodiment of the flip-flop shown in FIG. 1.

FIG. 2 illustrates an exemplary embodiment of the flip-flop 100, shown in FIG. 1. FIG. 2 shows a master/slave flip-flop 200, including a master latch 210, a slave latch 211 and a low leakage latch 212. Master latch 210 (e.g., a high Vt and low leakage latch) is a master data latch with low leakage properties. Slave latch 211 (e.g., a low Vt and high leakage latch) is a slave data latch with high speed properties. Master latch 210 and slave latch 211 form the high speed flip-flop 200. However, the high speed flip-flop 200 generally has a high leakage current.

To minimize leakage from the slave latch 211, inverters 221 and 220 in the slave latch 211 are connected to a virtual ground 230, which is connected to a real ground through a power switch 214. The power switch 214, which is activated by a capture signal 235, may include a large transistor, because the power switch 214 may have a low switching resistance requirement. Also, the power switch 214 may be shared by multiple flip-flops to reduce the area overhead. A PMOS de-coupling device 215 may be connected to the virtual ground 230 for discharging electrons caused by coupling when the virtual ground 230 is disconnected from the real ground. For example, when the power switch 214 turns off, coupling may cause a malfunction of the pull down devices in the power switch 214. The decoupling device 215 functions to discharge retained electrons, thereby minimizing the coupling effect.

Data received by the master latch 210 on a data input D of the flip-flop 200 is transmitted to the slave latch 211 when the capture signal 235 activates the power switch 214. The data is simultaneously transmitted to the low leakage latch 212, and then the power switch 214 removes power from the slave latch 211 in response to the capture signal deactivating the power switch 214. Therefore, the low leakage latch 212 retains the data when power is removed from the slave latch 211.

The low leakage latch 212 is connected to the data output Q of the flip-flop 200 through a release latch 213, which is activated by a release signal 240. When the release latch 214 is activated by the release signal 240, data retained by the low leakage latch 212 is transmitted to the data output Q of the flip-flop 200 from the low leakage latch 212. The low leakage latch 212 may be continually powered, but minimal leakage current is produced by a low leakage switch. The release latch 214 and the low leakage latch 212 function as data retainers, and small transistors that consume less power may be used for these latches.

The release signal 240 and the capture signal 235 may be complimentary. Therefore, after data is captured by the slave latch 211, the data is immediately released to the data output Q by the low leakage latch 212. Also, the capture signal 235 and the release signal 240 may be derived from a clock signal CLK used by the flip-flop 200.

Figure 3:
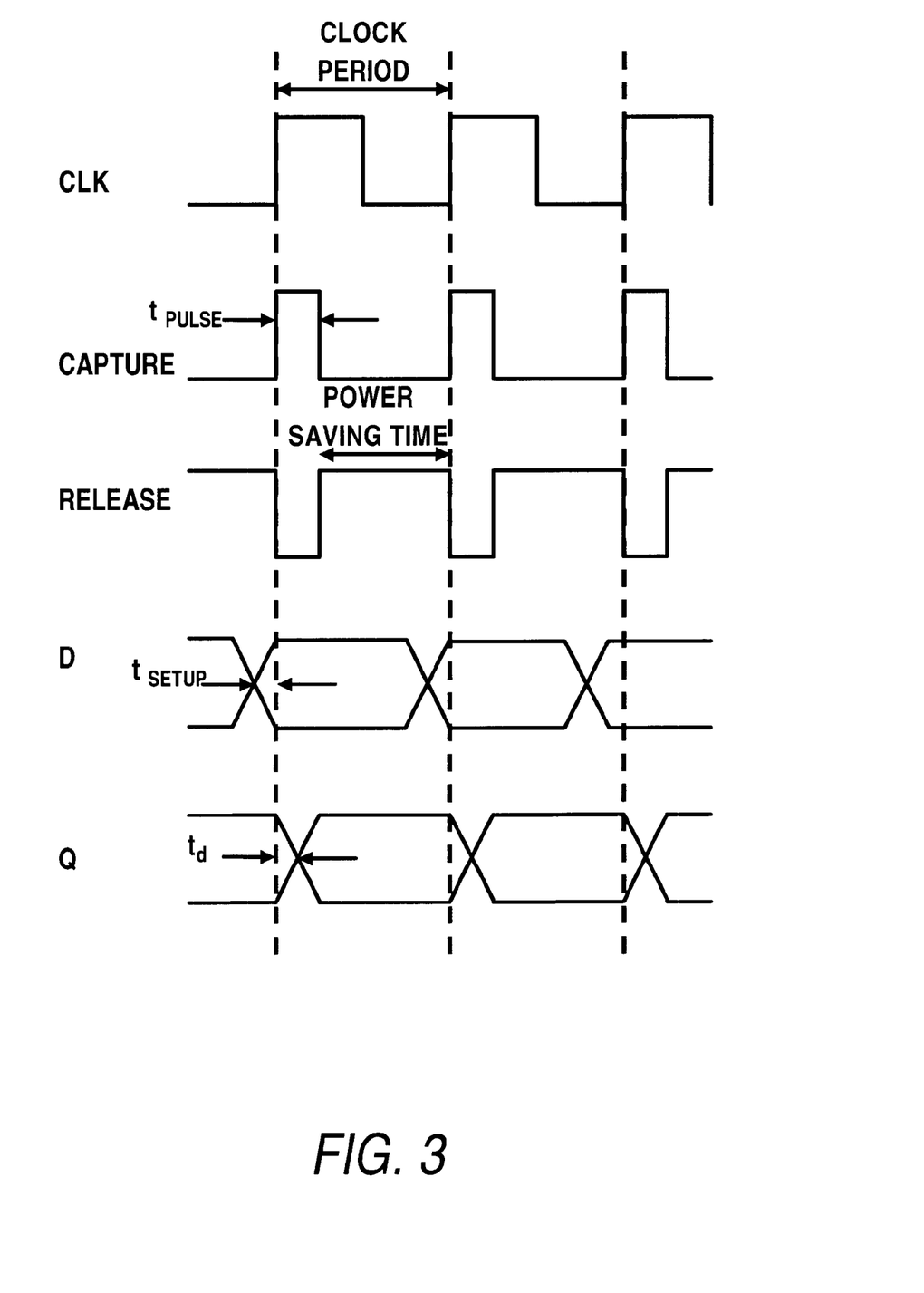
FIG. 3 illustrates a timing diagram for the flip-flop shown in FIG. 2.

FIG. 3 illustrates a timing diagram 300 showing a timing sequence of the flip-flop 200, LO shown in FIG. 2. The capture signal 235 may include a short pulse derived from the clock signal CLK. The pulse width ($t_{pulse}$) of the capture signal 235 may be wide enough (e.g., one tenth of the period of CLK) for the data to be captured by the slave latch 211 and transmitted to the low leakage latch 212 for storing the data. The slave latch 211 receives power for the duration of the pulse of the capture signal 235. Therefore, power is conserved by limiting the width of the pulse of the capture signal 235. The power saving time shown in FIG. 3 indicates the period of time that the power switch 214 removes power from the slave latch 211 to minimize power consumption by the slave latch 211.

The release signal 240, which releases the data stored in the low leakage latch 212 to the output Q, preferably is a complementary signal of the capture signal 235. D and Q illustrate the timing of data received on the input D of the flip-flop 200 and data output on the output Q of the flip-flop 200. When incoming data arrives at the input D of the flip-flop 200, the incoming data needs to satisfy the set up time ($t_{setup}$) of the master latch 210 before the positive edge of the clock signal CLK arrives. Accordingly, a transition (e.g., from "0" to "1" or vice versa) of the incoming data on the input D should be completed before the positive edge of the clock signal is received. The data stored in the low leakage latch is transmitted from the output Q after a delay time($t_d$) from the clock edge.

The set up time ($t_{setup}$) includes the length of time it takes the master latch 210 to stabilize the input transition. The set up time is determined by the propagation delay of the master latch 210 and is usually not as critical as an output delay of the master latch 210. Therefore, high Vt (i.e., slower speed) devices may be used in the master stage in order to reduce the complexity of the design of the flip-flop 200. However, when using the flip-flop 200 in a high speed, finite, state machine, both setup time and output delay of the flip-flop 200 may be equally important. Therefore, for a high speed, finite, state machine or other high speed uses of the flip-flop 200, the master latch 210 may include low Vt (i.e., higher speed) devices to improve performance.

Figure 4:
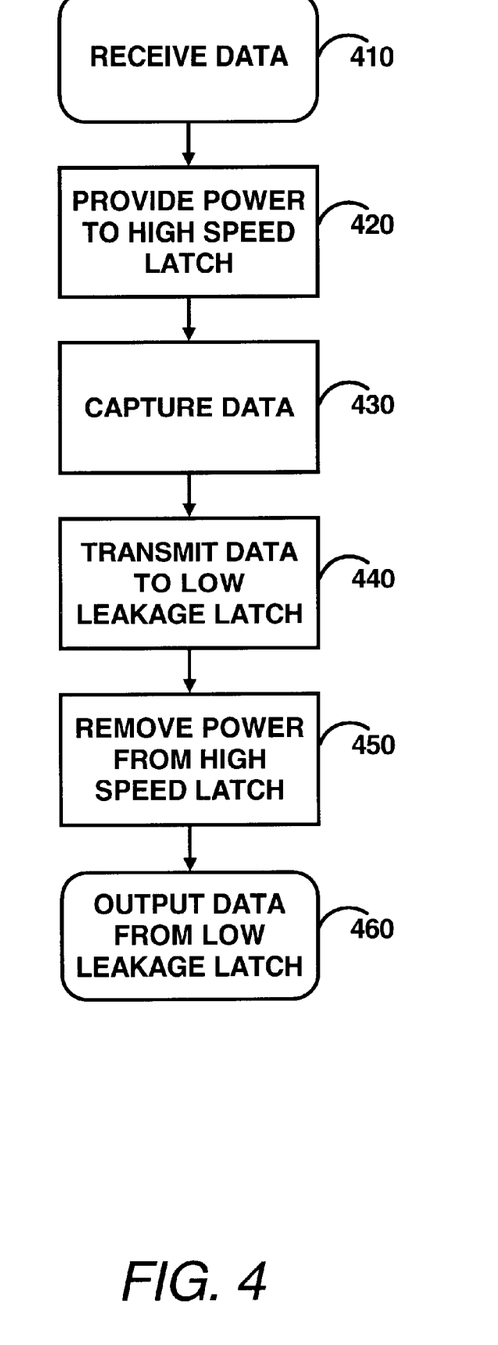
FIG. 4 illustrates a flow chart of an exemplary method employing principles of the present invention.

FIG. 4 illustrates an exemplary method employing principles of the present invention. In step 410, data is received by a flip-flop having a high speed latch (e.g., flip-flop 200). In step 420, power is provided to the high speed latch. In step 430, the high speed latch captures the data. In step 440, the data is transmitted to a low leakage latch connected to the high speed latch. In step 450, power provided to the high speed latch is removed. In step 460, the data is transmitted from the low leakage latch to the output of the flip-flop. It will be apparent to one of ordinary skill in the art that steps 420, 430 and 440 may be executed simultaneously and steps 450 and 460 may be executed simultaneously.

Figure 5:
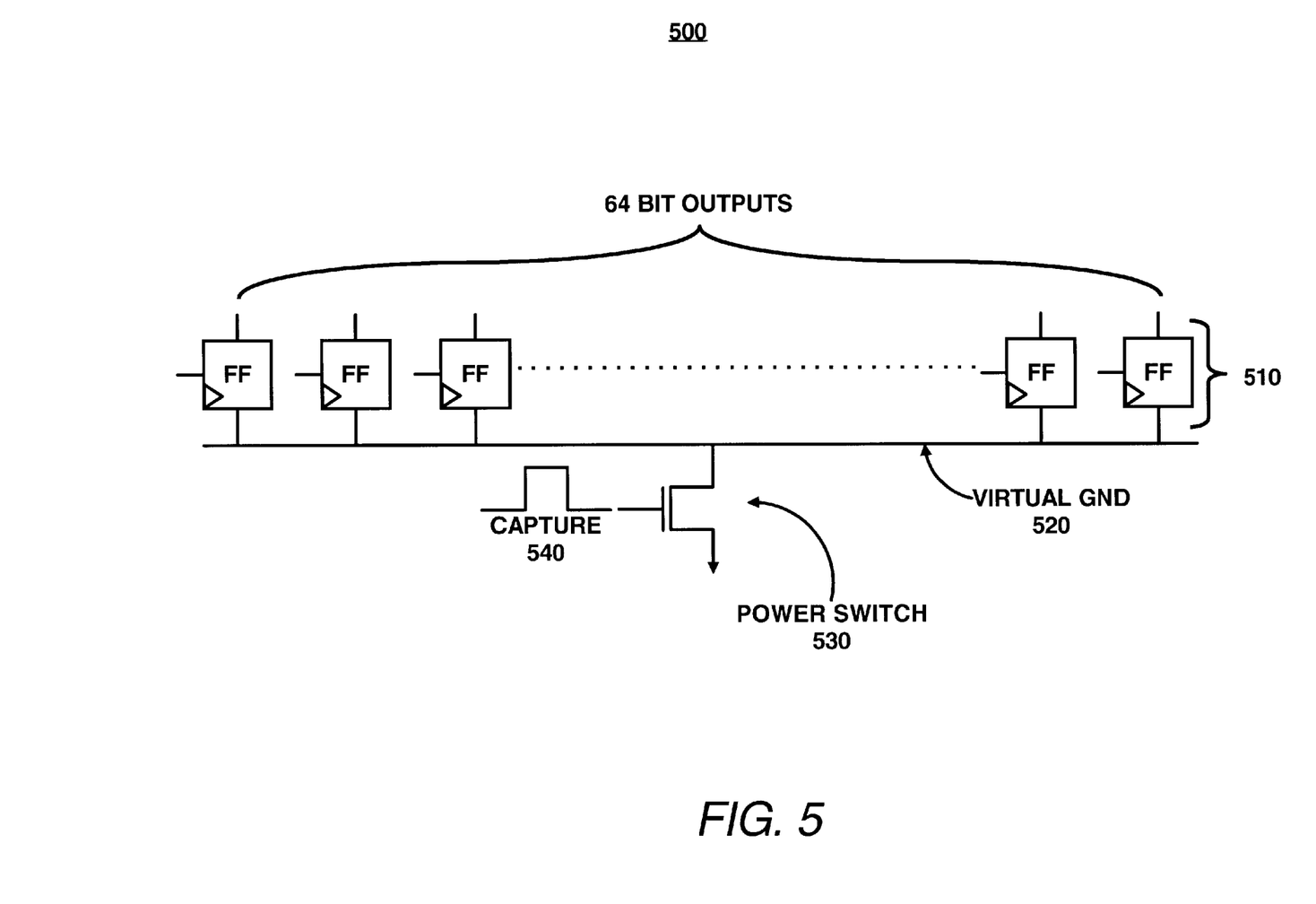
FIG. 5 illustrates a register including flip-flops of the present invention.

Flip-flops 100 and 200 may be used for a variety of applications, including a finite state machine, counter, register file, storage buffer, and the like. For example, FIG. 5 illustrates a flip-flop employing principles of the present invention utilized in a 64-bit register 500. Register 500 includes flip-flops 510, which may include flip-flops 100 or 200 shown in FIGS. 1 and 2 respectively, connected to a virtual ground 520. The virtual ground is connected to a power switch 530, which may include a large size FET, for controlling power applied to a high speed latch in each of the flip-flops 510 and for minimizing leakage current. A single power switch 530 may be used or one power switch for each register may be included in the register 500. Similar to the power switches 40 and 214 in flip-flops 100 and 200 respectively, the power switch 530 may provide power to a high speed latch in each of the flip-flops 500 temporarily. A capture signal 540 may be used to activate/deactivate the power switch 530.

Figure 6:
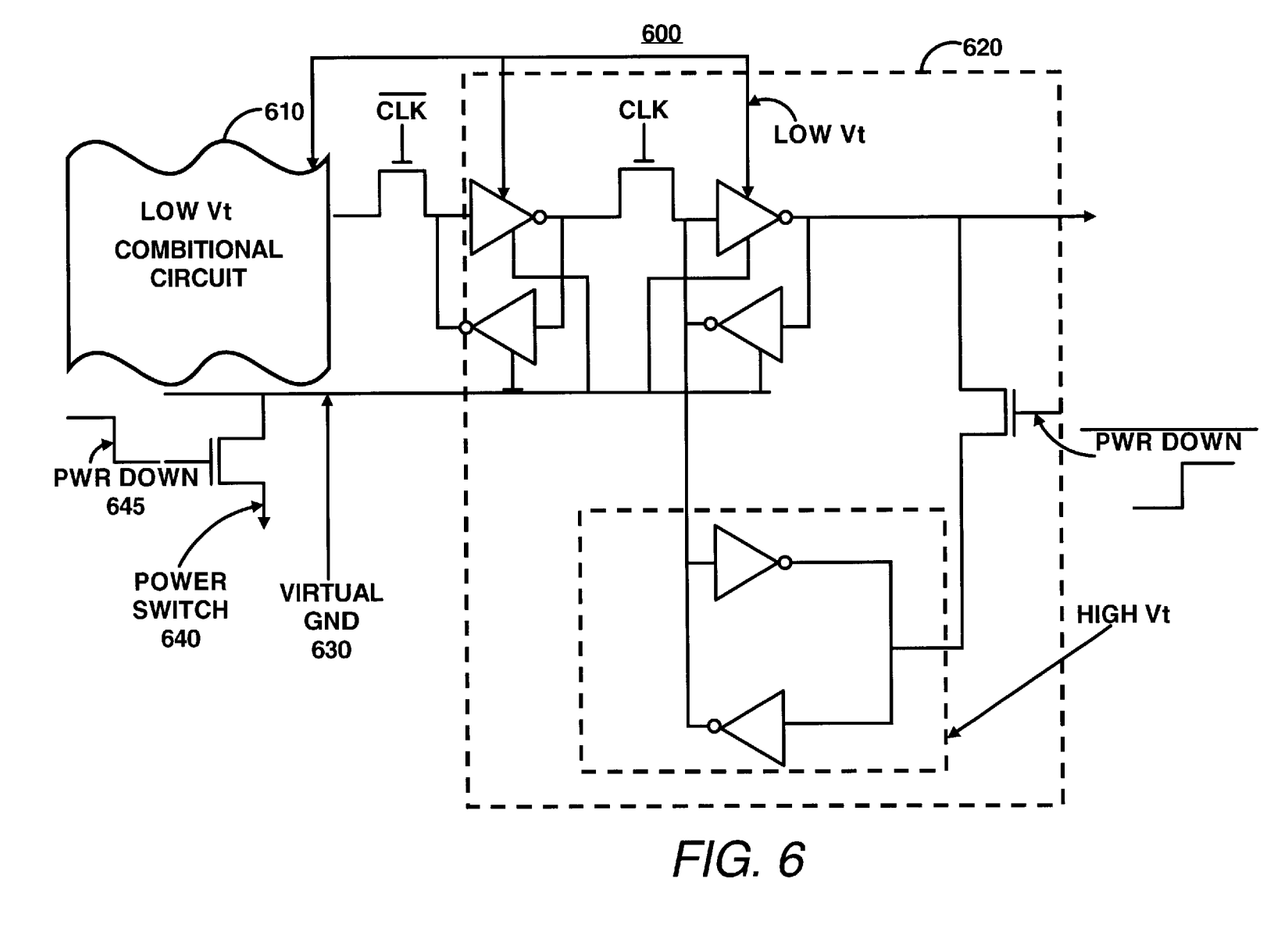
FIG. 6 illustrates a pipelined circuit including a flip-flop of the present invention.

Another example of an application for the flip-flops of the present invention is shown in FIG. 6 and described in co-pending U.S. patent application serial no. (Unassigned) (attorney docket No. 10013827), entitled "Power Management For A Pipelined Circuit", which is herein incorporated by reference. FIG. 6 illustrates a pipelined control circuit 600, including a combinational circuit 610 connected to a flip-flop 620. Flip-flop 620 may be configured similarly to flip-flop 100 or 200. The combinational circuit 610 and the flip-flop 620 include low threshold, high speed devices that tend to produce leakage current. A power switch 640 is connected to the low threshold devices through a virtual ground 630 for controlling power provided to the low threshold devices and for minimizing leakage current. Instead of capture and release signals, data capture and data output is controlled by a power down signal 645. The power down signal 645 controls whether the pipelined control circuit 600 is in a standby mode or an active mode. In standby mode, the power switch 640 functions to remove power from the low threshold devices, and power is conserved. In active mode, the low threshold devices receive power.

While this invention has been described in conjunction with the specific embodiments thereof, it is evident that many alternatives, modifications and variations will be apparent to those skilled in the art. There are changes that may be made without departing from the spirit and scope of the invention. Furthermore, it will be apparent to one of ordinary skill in the art that flip-flop types, other than a master-slave flip-flop, may be configured to employ the power saving techniques of the present invention. Also, it will be apparent to one of ordinary skill in the art that the flip-flops of the present invention may be used in applications other than shown in FIGS. 5–6.

What is claimed is:

1. A power efficient circuit comprising:

a first high speed latch;

a second low leakage latch connected to said first latch, said second latch being configured to receive data captured by the first latch;

a power switch connected to said first latch, said power switch regulating power provided to said first latch based on a received capture signal, such that the first latch is configured to capture said data and transmit said data to said second latch in response to receiving power when said power switch is activated; and wherein the capture signal is derived from a clock signal, the capture signal having a pulse width shorter than the clock signal.

2. The circuit of claim 1, wherein said second latch is configured to store said captured data when power is not provided to said first latch.

3. The circuit of claim 2, wherein said second latch is connected to a release switch, and said second latch is configured to output said stored data in response to said release switch being activated.

4. The circuit of claim 3, wherein said power switch is activated by said capture signal and said release switch is activated by a release signal, said capture signal being complimentary to said release signal.

5. The circuit of claim 4, wherein said power efficient circuit is a flip-flop.

6. The circuit of claim 5, wherein said first latch captures data received on an input of said flip-flop, and said second latch transmits said data to an output of said flip-flop.

7. The circuit of claim 5, wherein said flip-flop is a master-slave flip-flop.

8. The circuit of claim 1, wherein a decoupling device is connected to said power switch to minimize leakage current from said first switch when power is not provided to said first switch.

9. The circuit of claim 8, wherein said decoupling device is a PMOS decoupling device.

10. The circuit of claim 1, wherein said circuit is located in a register.

11. The circuit of claim 1, wherein said circuit is located in a pipelined circuit.

12. The circuit of claim 1, wherein said circuit is located in a finite state machine.

13. A flip-flop comprising:

a first low threshold latch;

a second high threshold latch connected to said first latch, said second latch being configured to receive data captured by the first latch;

a power switch connected to said first latch, said power switch regulating power provided to said first latch based on a received capture signal, such that the first latch is configured to capture said data and transmit said data to said second latch in response to receiving power when said power switch is activated, wherein the capture signal is derived from a clock signal, the capture signal having a pulse width shorter than the clock signal; and a third latch connected to an input of said first latch, said third latch being configured to receive data on an input of said flip-flop and configured to transmit said received data to said first latch in response to said first latch receiving power when said power switch is activated.

14. The flip-flop of claim 13, wherein said flip-flop includes a master-slave flip-flop.

15. The flip-flop of claim 14, wherein said third latch is in a master stage of said master-slave flip-flop and said second latch is in a slave stage of said master-slave flip-flop.

16. The flip-flop claim 13, wherein said second latch is configured to store said captured data when power is not provided to said first latch.

17. A flip-flop comprising:
a low threshold latch, such that the low threshold latch is connected to a virtual ground, wherein the virtual ground is connected to a real ground through a power switch;
a high threshold latch connected to said low threshold latch, the high threshold latch being configured to receive data captured by the low threshold latch in response to receiving power when said power switch is activated; and
wherein the power switch is connected to the low threshold latch and regulates power in response to a capture signal such that the low threshold latch is configured to capture said a data and transmit said data to said high threshold latch in response to receiving power when said power switch is activated by the capture signal, wherein the capture signal is derived from a clock signal, the capture signal having a pulse width shorter than the clock signal.

18. The flip-flop of claim 12, wherein the low threshold latch is a high leakage latch and the high threshold latch is a low leakage latch.

* * * * *